(12) United States Patent
Morita

(10) Patent No.: US 7,755,912 B2
(45) Date of Patent: Jul. 13, 2010

(54) PRINTED CIRCUIT BOARD UNIT AND ELECTRONIC APPARATUS

(75) Inventor: Yoshihiro Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 177 days.

(21) Appl. No.: 11/882,581

(22) Filed: Aug. 2, 2007

(65) Prior Publication Data

US 2008/0068817 A1    Mar. 20, 2008

(30) Foreign Application Priority Data

Sep. 20, 2006   (JP) ............................. 2006-255083

(51) Int. Cl.
*H05K 1/11* (2006.01)
(52) U.S. Cl. ...................... 361/803; 361/760
(58) Field of Classification Search ................ 361/760, 361/777, 807, 803, 804; 439/73, 66, 515
See application file for complete search history.

(56) References Cited

U.S. PATENT DOCUMENTS

| | | | | |
|---|---|---|---|---|
| 3,998,512 | A * | 12/1976 | Anhalt et al. | 439/66 |
| 6,556,455 | B2 * | 4/2003 | Dibene et al. | 361/785 |
| 6,711,811 | B2 * | 3/2004 | Hensley et al. | 29/836 |
| 6,932,618 | B1 * | 8/2005 | Nelson | 439/66 |
| 7,196,907 | B2 * | 3/2007 | Zheng | 361/760 |
| 7,564,690 | B2 * | 7/2009 | Gilliland et al. | 361/719 |
| 2008/0285235 | A1 * | 11/2008 | Farrow et al. | 361/704 |

FOREIGN PATENT DOCUMENTS

| JP | 2000-105267 | 4/2000 |
|---|---|---|
| JP | 2000-332168 | 11/2000 |
| JP | 2003-249324 | 9/2003 |

OTHER PUBLICATIONS

"Land grid array sockets for server applications", by J. S. Corbin, C. N. Ramirez, D. E. Massey, IBM J. Res & Dev. vol. 46, No. 6 pp. 763-778, Nov. 2002.

* cited by examiner

*Primary Examiner*—Jeremy C Norris
*Assistant Examiner*—Yuriy Semenenko
(74) *Attorney, Agent, or Firm*—Fujitsu Patent Center

(57) ABSTRACT

A printed circuit board unit includes a first board and a second board. First electrically-conductive terminals are fixed and exposed on the front surface of the first board in a matrix. Second electrically-conductive terminals are arranged in a matrix and supported on the front surface of the second board. The second electrically-conductive terminals have flexibility. Each of the second electrically-conductive terminals is disengageably brought in contact with the corresponding first electrically-conductive terminal. A static pressure member is received on the back surface of the first board within an area corresponding to the specific area to generate a static pressure. An urging plate is overlaid on the static pressure member so that the static pressure member is interposed between the urging plate and the first board. The urging plate exhibits an urging force applied to the first board toward the second board.

15 Claims, 9 Drawing Sheets

PRINTED CIRCUIT BOARD UNIT AND ELECTRONIC APPARATUS

BACKGROUND OF THE INVENTION

1. Field of the Invention

The present invention relates to a printed circuit board unit including first electrically-conductive terminals fixed and exposed on a board in a matrix and second electrically-conductive terminals having flexibility arranged in a matrix, for example. The second electrically-conductive terminals are disengageably brought in contact with the corresponding first electrically-conductive terminals.

2. Description of the Prior Art

A land grid array (LGA) socket is well known as disclosed in "Land grid array sockets for server applications", J. S. Corbin et al., IBM J. RES. & DEV., Vol. 46, No. 6, p. 763-778, November, 2002, for example. The LGA socket is utilized to mount a large scale integrated (LSI) package. The LGA socket has lower electrically-conductive terminals arranged on the lower surface of a socket board to be respectively received on electrically-conductive pads on a printed wiring board. Upper electrically-conductive terminals are arranged on the upper surface of the socket board. The upper electrically-conductive terminals are connected to the corresponding lower electrically-conductive terminals, respectively. The upper electrically-conductive terminals receive corresponding electrically-conductive terminals of the LSI package. The LGA socket serves to establish electric conduction between an electronic component package board and the printed wiring board in this manner.

The LSI package is urged against the printed wiring board. A plate is utilized for urging. The plate is overlaid on the LSI package. An urging force is applied to the four corners of the plate toward the printed wiring board. Distortion in the plate leads to reduction in the urging force on the center of the plate. This results in a failure in electric conduction between the upper electrically-conductive terminals and the corresponding electrically-conductive terminals of the LSI package and/or between the lower electrically-conductive terminals and the electrically-conductive pads on the printed wiring board, even if the urging force is enhanced as much as possible. In particular, enhancement in rigidity of the socket board leads to increase the possibility of failure in electric conduction.

SUMMARY OF THE INVENTION

It is accordingly an object of the present invention to provide a printed circuit board unit capable of reliably avoiding failure in electric conduction.

According to the present invention, there is provided a printed circuit board unit comprising: a first board; first electrically-conductive terminals fixed and exposed on the front surface of the first board within a specific area of the first board in a matrix; second electrically-conductive terminals having flexibility arranged in a matrix, each of the second electrically-conductive terminals disengageably brought in contact with the corresponding first electrically-conductive terminal; a second board having the front surface for supporting the second electrically-conductive terminals; a static pressure member received on the back surface of the first board within an area corresponding to the specific area to generate a static pressure; and an urging plate overlaid on the static pressure member so that the static pressure member is interposed between the urging plate and the first board to exhibit an urging force applied to the first board toward the second board.

The printed circuit board unit allows transmission of an urging force from the static pressure member to the first board. The first board is subjected to the urging force toward the second board. The first electrically-conductive terminals are thus urged against the corresponding second electrically-conductive terminals. The static pressure member allows a uniform application of the urging force to the first board over a plane. Even if the urging plate is distorted, the urging force is uniformly applied to the first board. The equal urging force is applied to each of the first electrically-conductive terminals. All the first electrically-conductive terminals are thus reliably brought in contact with the corresponding second electrically-conductive terminals. This results in a reliable establishment of electric conduction between each of the first electrically-conductive terminals and the corresponding second electrically-conductive terminal. In the case where the urging force is unevenly applied, the first electrically-conductive terminal or terminals are allowed to receive a reduced urging force in a local area or areas. This often result in a failure in electric conduction between the first electrically-conductive terminal/terminals and the corresponding second electrically-conductive terminal/terminals.

In particular, each of the second electrically-conductive terminals may comprise a solid silicone rubber and silver particles dispersing in the silicone rubber. When the second electrically-conductive terminal receives a reduced urging force in a local area, the silicone rubber gets into a space between the silver particles and the corresponding first electrically-conductive terminal in the second electrically-conductive terminal. The silicone rubber gets into depressions formed on the surface of the first electrically-conductive terminal due to the surface roughness of the first electrically-conductive terminal. This results in prevention of contact of the silver particles. Failure in electric conduction is caused between the second electrically-conductive terminal and the corresponding first electrically-conductive terminal.

The static pressure member may include a bag and a fluid filled in the bag. The bag may be made of resin or a metallic film, for example. The bag may be sealed to keep the fluid body such as air, water or oil inside. As long as the static pressure member can generate a static pressure, the static pressure member may take any shape or form.

The printed circuit board unit can be utilized in a large-sized computer apparatus or other kinds of electronic apparatus, for example. The electronic apparatus may comprise: a first board; first electrically-conductive terminals fixed and exposed on the front surface of the first board within a specific area of the first board in a matrix; second electrically-conductive terminals having flexibility arranged in a matrix, each of the second electrically-conductive terminals disengageably brought in contact with the corresponding first electrically-conductive terminal; a second board having the front surface for supporting the second electrically-conductive terminals; a static pressure member received on the back surface of the first board within an area corresponding to the specific area to generate a static pressure; and an urging plate overlaid on the static pressure member so that the static pressure member is interposed between the urging plate and the first board to exhibit an urging force applied to the first board toward the second board.

The printed circuit board unit may further comprise: an electronic component chip mounted on the back surface of the first board; and a heat sink placed on the back side of the urging plate, the heat sink extending through window openings respectively defined in the urging plate and the static pressure member to touch the electronic component chip. The first board and the electronic component chip in combination establish a so-called electronic component chip package. The heat sink contributes to radiation of heat from the electronic component chip. The printed circuit board unit can be utilized when the electronic component chip package is mounted. The second board can serve as a land grid array (LGA) socket interposed between a printed wiring board and the electronic component chip package, for example.

Here, the printed circuit board unit may further comprise: an opening formed in the second board, the opening penetrating through the second board between the front surface and the back surface of the second board; third electrically-conductive terminals having flexibility arranged in a matrix on the back surface of the second board at a position around the opening, each of the third electrically-conductive terminals connected to the corresponding second electrically-conductive terminal; a third board having a front surface facing the back surface of the second board at a distance; fourth electrically-conductive terminals fixed on the front surface of the third board in a matrix, each of the fourth electrically-conductive terminals disengageably brought in contact with the corresponding third electrically-conductive terminal; and an electronic component mounted on the front surface of the third board, the electronic component disposed in the opening. The electronic component can be placed directly below the second board in this manner. The second board has a relatively large thickness to keep a sufficient strength regardless of the formation of the opening. The rigidity of the second board is also enhanced. The static pressure member serves to equalize the urging force. In the case where the opening is not formed in the second board, the second board may have a relatively small thickness. The second board can deform according to a distortion of the urging plate. Unevenness in the urging force can thus relatively be reduced.

The printed circuit board unit may further comprise: third electrically-conductive terminals having flexibility arranged in a matrix on the back surface of the second board, each of the third electrically-conductive terminals connected to the corresponding second electrically-conductive terminal; a third board having a front surface facing the back surface of the second board at a distance; fourth electrically-conductive terminals fixed on the front surface of the third board in a matrix, each of the fourth electrically-conductive terminals disengageably brought in contact with the corresponding third electrically-conductive terminal; an electronic component chip mounted on the back surface of the third board; and an auxiliary urging plate brought in contact with the back surface of the third board, the auxiliary urging plate exhibiting an urging force applied to the third board toward the second board. The third board and the electronic component chip in combination establish a so-called electronic component chip package. Specifically, the printed circuit board unit can be utilized when the electronic component chip package is mounted. The second board can serve as a LGA socket interposed between a printed wiring board and the electronic component chip package, for example.

Here, the printed circuit board unit may further comprise: an opening formed in the second board, the opening penetrating through the second board between the front surface and the back surface of the second board; and an electronic component mounted on the front surface of the first board, the electronic component disposed in the opening. The electronic component can be placed directly below the second board in this manner. The second board has a relatively large thickness to keep a sufficient strength regardless of the formation of the opening. The rigidity of the second board is also enhanced. The static pressure member serves to equalize the urging force.

The printed circuit board unit may further comprise: third electrically-conductive terminals having flexibility arranged in a matrix on the back surface of the second board, each of the third electrically-conductive terminals connected to the corresponding second electrically-conductive terminal; a third board having the front surface facing the back surface of the second board at a distance; fourth electrically-conductive terminals exposed on the front surface of the third board within a specific area of the third board in a matrix, each of the fourth electrically-conductive terminals disengageably brought in contact with the corresponding third electrically-conductive terminal; an electronic component chip mounted on the back surface of the third board; an auxiliary static pressure member received on the back surface of the third board within an area corresponding to the specific area to generate a static pressure; and an auxiliary urging plate overlaid on the auxiliary static pressure member so that the auxiliary static pressure member is interposed between the auxiliary urging plate and the third board to exhibit an urging force applied to the third board toward the second board.

The printed circuit board unit allows transmission of an urging force from the static pressure member to the first board in the same manner as described above during transmission of an urging force from the auxiliary static pressure member to the third board. The third board is subjected to the urging force toward the second board. The fourth electrically-conductive terminals are thus urged against the corresponding third electrically-conductive terminals. The auxiliary static pressure member allows a uniform application of the urging force to the third board over a plane. Even if the urging plate is distorted, the urging force is uniformly applied to the third board. The equal urging force is applied to each of the fourth electrically-conductive terminals. All the fourth electrically-conductive terminals are reliably brought in contact with the corresponding third electrically conductive terminals. This results in a reliable establishment of electronic conduction between each of the fourth electrically-conductive terminals and the corresponding third electrically-conductive terminal. The third board and the electronic component chip establish a so-called electronic component chip package. The second board can serve as a LGA socket interposed between a printed wiring board and the electronic component chip package, for example. The third board serves as a printed wiring board on which the electronic component chip package is mounted.

The printed circuit board unit may further comprise: an opening formed in the second board, the opening penetrating from the front surface to the back surface of the second board; an electronic component mounted on the front surface of the first board, the electronic component exposed in the opening; third electrically-conductive terminals having flexibility arranged in a matrix on the back surface of the second board at a position around the opening, each of the third electrically-conductive terminals connected to the corresponding second electrically-conductive terminal; a third board having a front surface facing the back surface of the second board at a distance; fourth electrically-conductive terminals exposed on the front surface of the third board within a specific area of the third board in a matrix, each of the fourth electrically-conductive terminals disengageably brought in contact with the corresponding third electrically-conductive terminal; an electronic component chip mounted on the back surface of the third board; an auxiliary static pressure member received on the back surface of the third board within an area corresponding to the specific area to generate a static pressure; and an auxiliary urging plate overlaid on the auxiliary static pressure member so that the auxiliary static pressure member is interposed between the auxiliary urging plate and the third board to exhibit an urging force applied to the third board toward the second board.

The printed circuit board unit allows transmission of an urging force from the static pressure member to the first board in the same manner as described above during transmission of an urging force from the auxiliary static pressure member to the third board. The third board is subjected to the urging force toward the second board. The fourth electrically-conductive terminals are thus urged against the corresponding third electrically-conductive terminals. The auxiliary static pressure member allows a uniform application of the urging force to the third board over a plane. Even if the urging plate is distorted, the urging force is uniformly applied to the third board. The equal urging force is applied to each of the fourth electrically-conductive terminals. All the fourth electrically-conductive terminals are reliably brought in contact with the corresponding third electrically conductive terminals. This results in a reliable establishment of electronic conduction between each of the fourth electrically-conductive terminals and the corresponding third electrically-conductive terminal. The third board and the electronic component chip establish a so-called electronic component chip package. The second board can serve as a LGA socket interposed between a printed wiring board and the electronic component chip package, for example. The third board serves as a printed wiring board on which the electronic component chip package is mounted. Moreover, the electronic component can be placed directly below the second board. The second board has a relatively large thickness to keep a sufficient strength regardless of the formation of the opening. The rigidity of the second board is also enhanced. The static pressure member serves to equalize the urging force.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
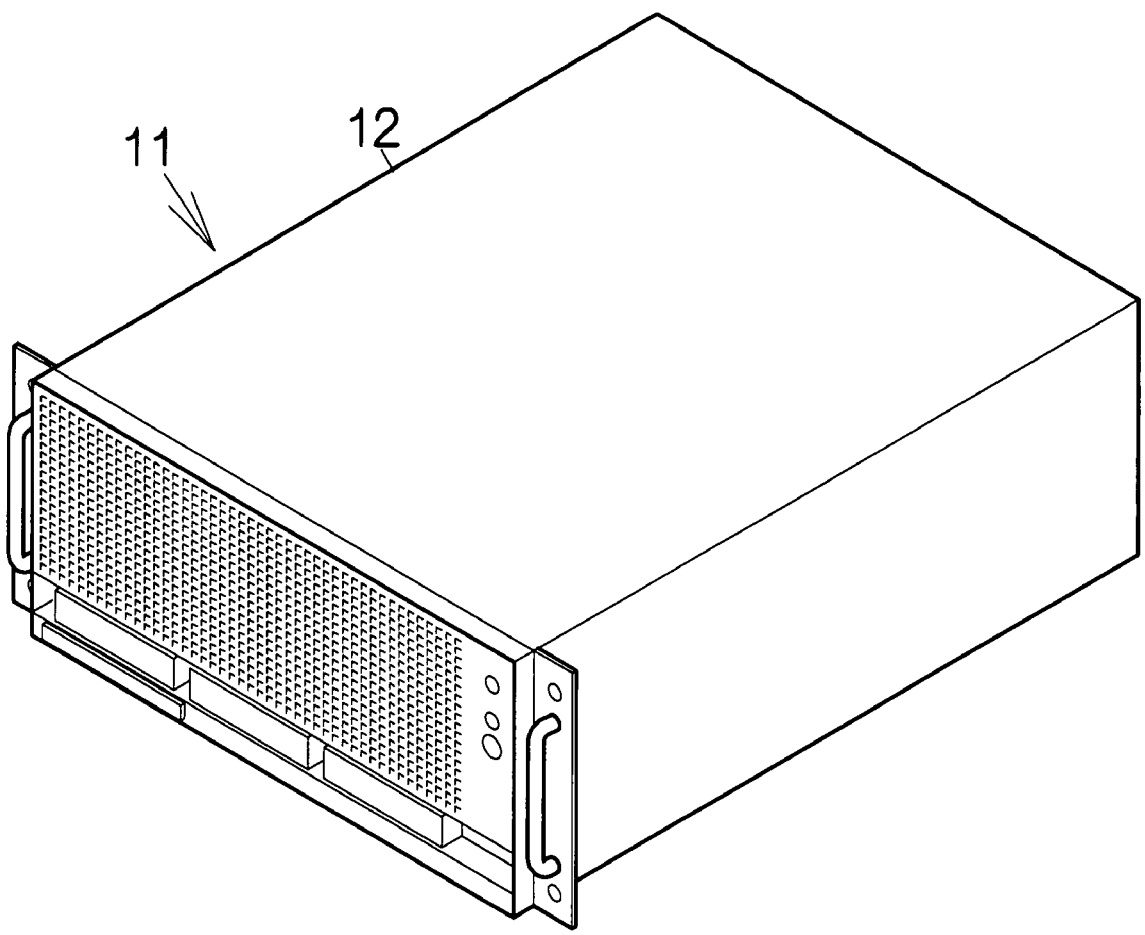
FIG. 1 is a perspective view schematically illustrating the structure of a server computer apparatus as an electronic apparatus according to an example of the present invention.

FIG. 1 schematically illustrates the structure of a server computer apparatus 11 as an electronic apparatus according to a specific example of the present invention. A server computer apparatus 11 includes an enclosure 12. The enclosure 12 defines an inner space. A motherboard is placed within the inner space, for example. The aftermentioned large-scale integrated (LSI) chip package, a memory and the like are mounted on the motherboard. The LSI chip package is designed to execute various kinds of processing based on a software program and/or data temporarily held in the memory, for example. The software program and/or data may be stored in a large-capacity storage such as a hard disk drive, HDD, likewise placed within the inner space. The server computer apparatus 11 is mounted on a rack, for example.

Figure 2:
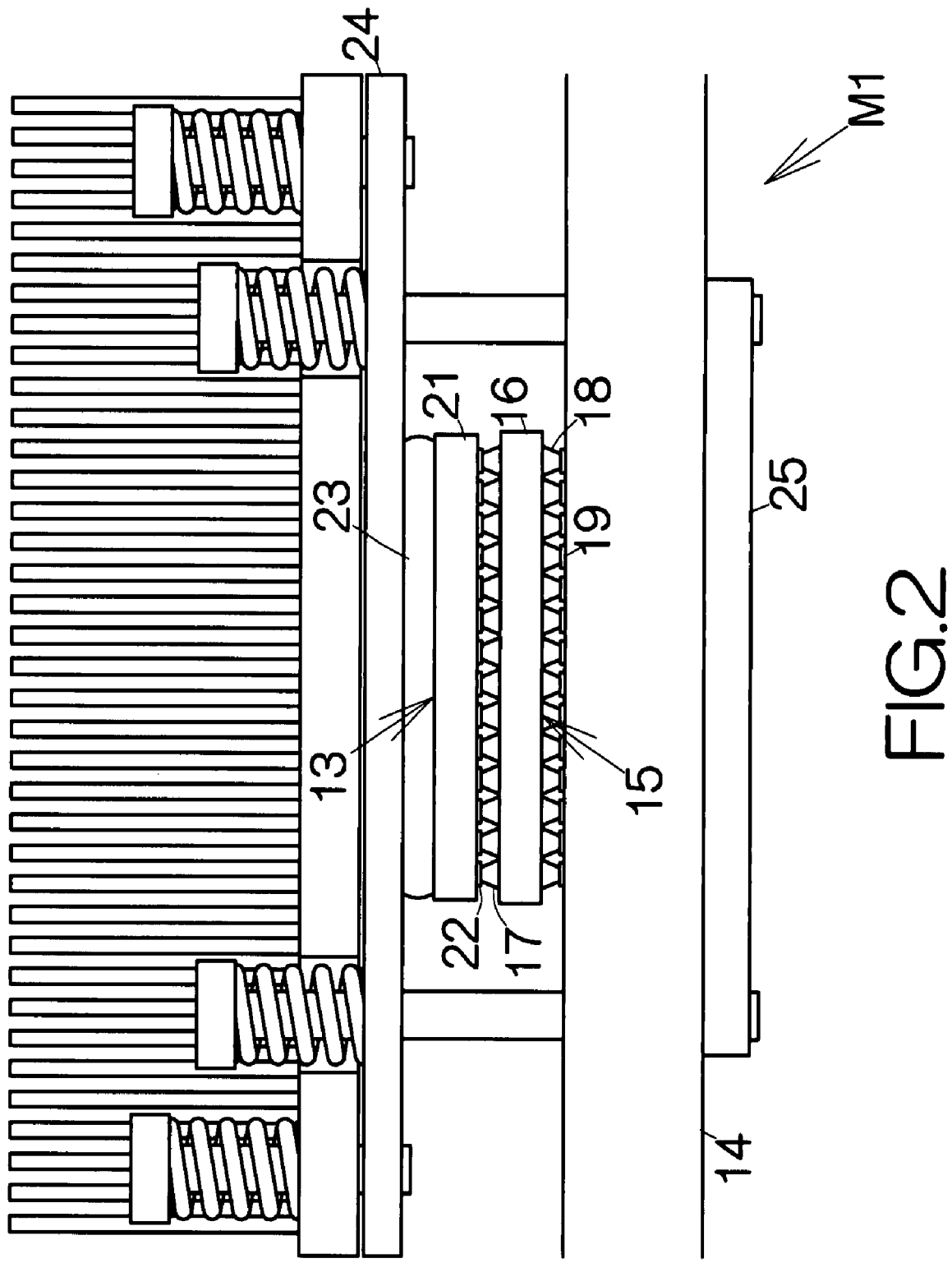
FIG. 2 is a side view schematically illustrating the structure of a motherboard according to a first embodiment of the present invention.

As shown in FIG. 2, a so-called land grid array (LGA) socket 15 is interposed between a LSI chip package 13 and a printed wiring board 14 in a motherboard M1 according to a first embodiment of the present invention. The LGA socket 15 includes a socket board 16. The socket board 16 may be made of a resin material, for example. The thickness of the socket board 16 is set at approximately 2.0 mm, for example. Electrically-conductive terminals 17 are arranged in a matrix on the upper surface of the socket board 16. The LSI chip package 13 is received on the electrically-conductive terminals 17. Electrically-conductive terminals 18 are likewise arranged in a matrix on the lower surface of the socket board 16. The socket board 16 is received on the upper surface of the printed wiring board 14 at the electrically-conductive terminals 18.

Electrically-conductive terminals 19 are arranged in a matrix on the upper surface of the printed wiring board 14 within a specific area. The electrically-conductive terminals 19 receive the electrically-conductive terminals 18 of the LGA socket 15. The electrically-conductive terminals 18 of the LGA socket 15 are related to the electrically-conductive terminals 19 on the printed wiring board 14 on one-on-one correspondence.

The LSI chip package 13 includes a package board 21. Electrically-conductive terminals 22 are arranged in a matrix on the lower surface of the package board 21 within a specific area. A static pressure member 23 is received on the upper surface of the package board 21 within the area corresponding to the specific area. An urging plate 24 is received on the static pressure member 23. The static pressure member 23 is interposed between the package board 21 and the urging plate 24. The static pressure member 23 will be described later in detail.

Figure 3:
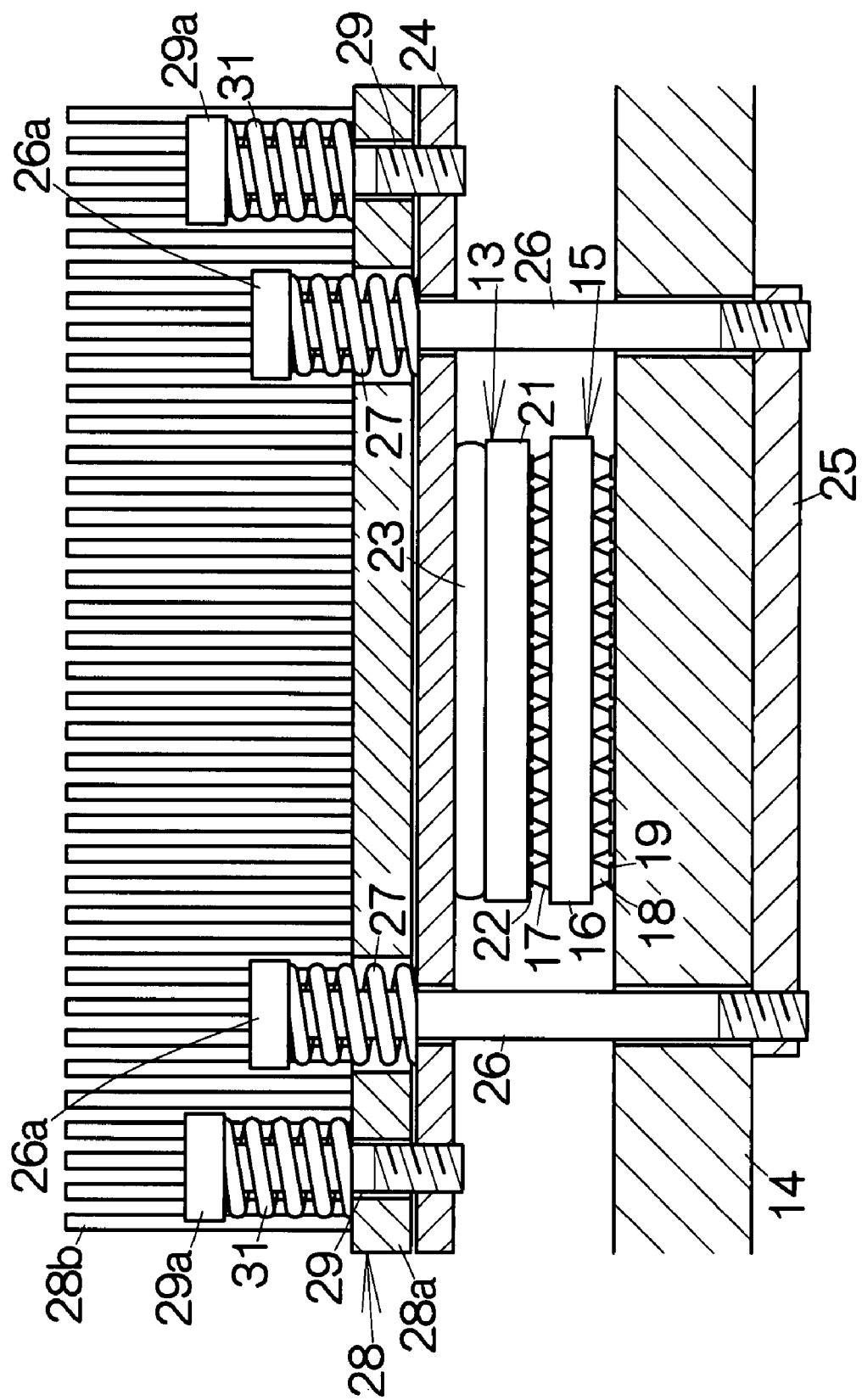
FIG. 3 is a vertically sectional view of a printed wiring board, an urging plate and a heat sink.

A bolster plate 25 is coupled to the urging plate 24. The bolster plate 25 is overlaid on the lower surface of the printed wiring board 14. As is apparent from FIG. 3, four bolts 26 are screwed into the bolster plate 25, for example. The bolts 26 are kept in an attitude perpendicular to the upper surface of the printed wiring board 14. Each of the bolts 26 penetrates through the urging plate 24 and the printed wiring board 14. The bolts 26 are placed at positions outside the four corners of the package board 21, respectively. The bolts 26 may be placed on the extensions of the diagonal lines of the package board 21.

Each of the bolts 26 includes a bolt head 26a. An elastic member 27 is interposed between the bolt head 26a and the urging plate 24. The elastic member 27 may be a helical spring exhibiting an elastic force to distance the bolt head 26a and the urging plate 24 from each other, for example. The urging plate 24 thus exhibits an urging force toward the printed wiring board 14. The urging plate 24 is urged against the static pressure member 23. The urging force of the urging plate 24 is transmitted to the LSI chip package 13 through the static pressure member 23. The electrically-conductive terminals 22 of the LSI chip package 13 are urged against the electrically-conductive terminals 17 of the LGA socket 15, respectively. The electrically-conductive terminals 17 are disengageably brought in contact with the electrically-conductive terminals 22 in this manner. The electrically-conductive terminals 22 may be related to the electrically-conductive terminals 17 on one-on-one correspondence. The electrically-conductive terminals 18 of the LGA socket 15 are likewise urged against the electrically-conductive terminals 19 on the printed wiring board 14. The electrically-conductive terminals 18 are disengageably brought in contact with the electrically-conductive terminals 19.

A heat sink 28 is coupled to the urging plate 24. The heat sink 28 includes a base plate 28a extending in parallel with the upper surface of the urging plate 24. Fins 28b stand upright in the vertical direction from the base plate 28a. The fins 28b extend in parallel with one another. An air passage is thus defined between the adjacent ones of the fins 28b.

Four bolts 29 are utilized to couple the heat sink 28 to the urging plate 24, for example. The tips of the bolts 29 are screwed into the urging plate 24. The bolts 29 are kept in an attitude perpendicular to the upper surface of the urging plate 29. Each of the bolts 29 penetrates through the base plate 28a of the heat sink 28. The bolts 29 may be placed outside a rectangle having four corners respectively on the bolts 26. Each of the bolts 29 includes a bolt head 29a. An elastic member 31 is interposed between the bolt head 29a and the base plate 28a. The elastic member 31 may be a helical spring exhibiting an elastic force distance the bolt head 29a and the base plate 28a from each other, for example. The heat sink 28 is urged toward the urging plate 24 in this manner.

Figure 4:
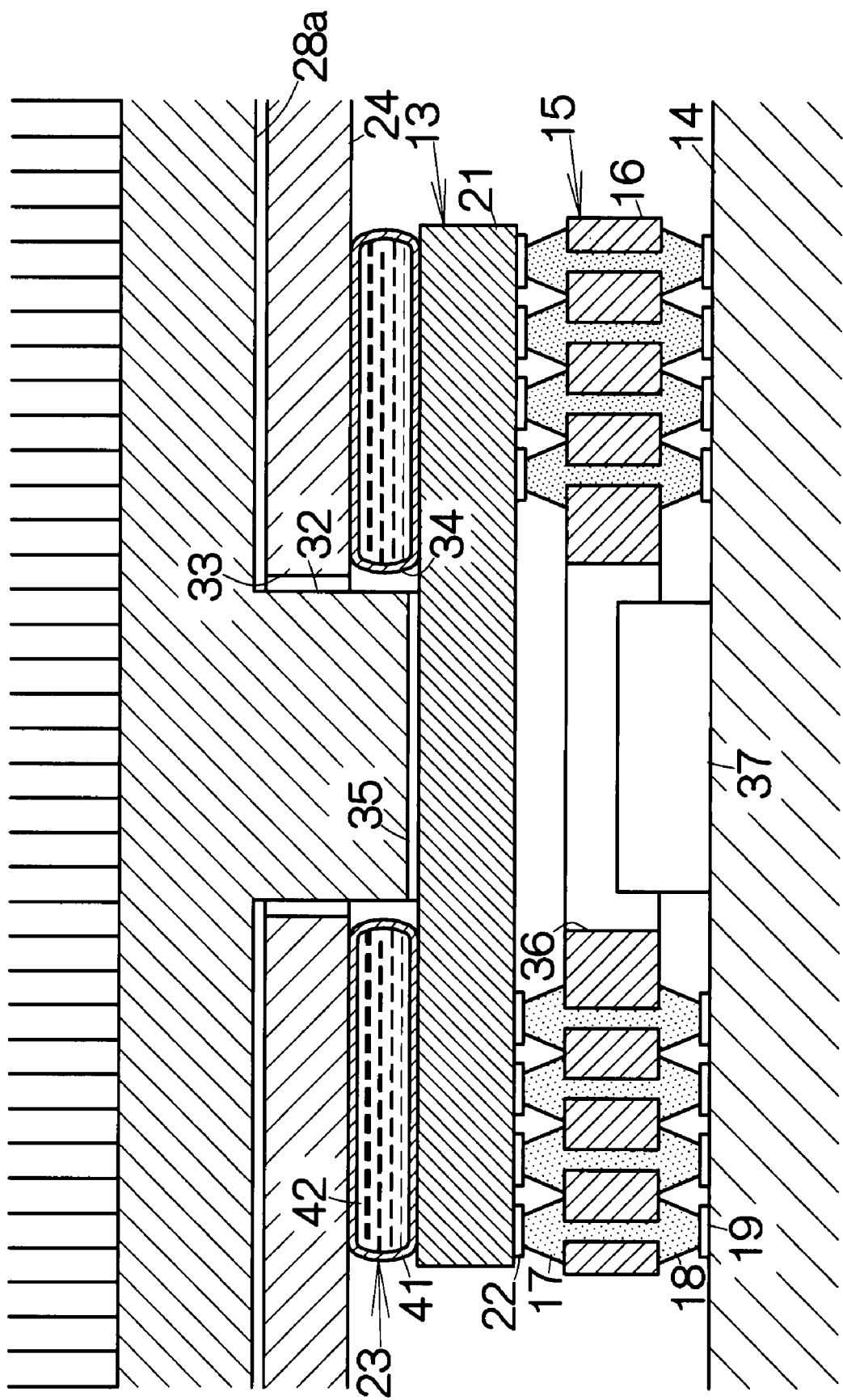
FIG. 4 is an enlarged partially vertical sectional view of the motherboard.

As shown in FIG. 4, a protuberance 32 is formed in the heat sink 28. The protuberance 32 extends downward from the lower surface of the base plate 28a toward the LSI chip package 13. The protuberance 32 is placed in window openings 33, 34 respectively defined in the urging plate 24 and the static pressure member 23. The lower end of the protuberance 32 is in contact with a LSI chip 35 on the upper surface of the package board 21. The LSI chip 35 is mounted on the upper surface of the package board 21. The LSI chip 35 is placed inside the window opening 34 of the static pressure member 23. The heat of the LSI chip 35 is transmitted to the heat sink 28 in this manner. A heat conductive material such as a heat conductive paste or the like may be interposed between the protuberance 32 and the LSI chip 35. The heat conductive material serves to increase the contact area between the protuberance 32 and the LSI chip 35. The heat of the LSI chip 35 can thus be transmitted to the heat sink 28 with a higher efficiency. The heat sink 28 radiates the heat into the air.

The LGA socket 15 allows connection between the electrically-conductive terminals 17 on the upper surface and the electrically-conductive terminals 18 on the lower surface. The electrically-conductive terminals 17 are related to the electrically-conductive terminals 18 on one-on-one correspondence. Through holes are formed in the socket board 16 to connect the electrically-conductive terminals 17 to the electrically-conductive terminals 18. The through holes penetrate through the socket board 16 between the upper surface and the lower surface of the socket board 16. The through hole enables an integral formation of the electrically-conductive terminal 17 and the corresponding electrically-conductive terminal 18.

The electrically-conductive terminals 17, 18 are formed integrally with each other. Silicone rubber is employed to mold the electrically-conductive terminals 17, 18. The electrically-conductive terminals 17, 18 thus have flexibility. Silver particles disperse in the silicone rubber. The silver particles are contained in the silicone rubber a content equal to or larger than 90% by volume. Specifically, the silicone rubber serves as a so-called binder. The silver particles may have the diameter of approximately 1 μm, for example. The silver particles serve to establish electric conduction from the electrically-conductive terminals 22 of the LSI chip package 13 to the electrically-conductive terminals 19 of the printed wiring board 14.

Figure 5:
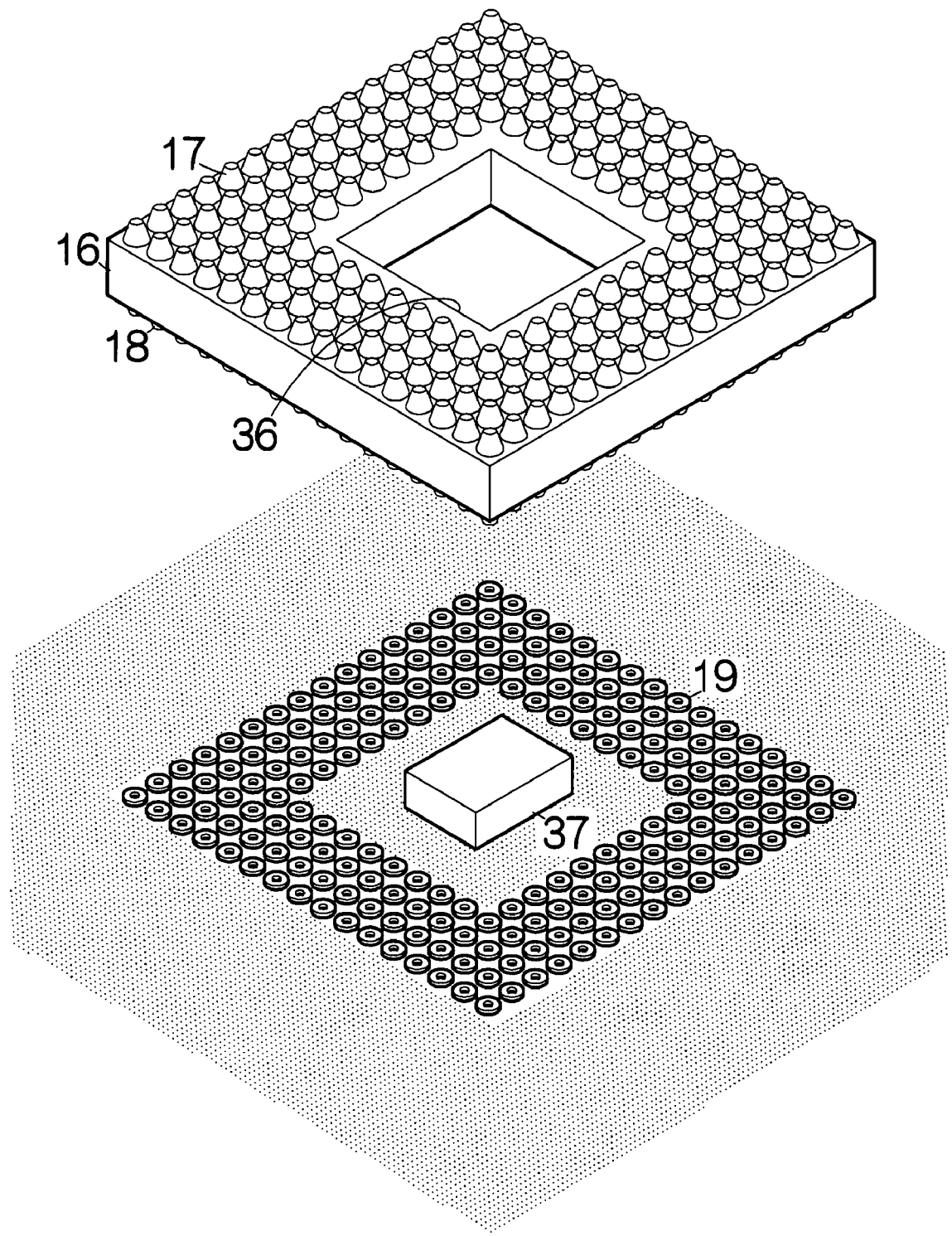
FIG. 5 is an enlarged exploded view of a socket board and the printed wiring board.

Referring also to FIG. 5, an opening 36 is formed in the socket board 16 within the aforementioned specific area. The opening 36 penetrates through the socket board 16 between the upper surface and the lower surface of the socket board 16. The electrically-conductive terminals 17, 18 surround the opening 36.

A mounting area for an electronic component is defined in the upper surface of the printed wiring board 14 within the aforementioned specific area. The mounting area is opposed to the opening 36 of the socket board 16. Here, a chip capacitor 37 is mounted on the upper surface of the printed wiring board 14 within the mounting area. The chip capacitor 37 may be connected to the LSI chip 35, for example. The chip capacitor 37 serves to suppress distortion of the waveform of a signal input into or output from the LSI chip 35. The capacitance of the chip capacitor 37 may be set depending on the operating frequency of the LSI chip 35.

Figure 6:
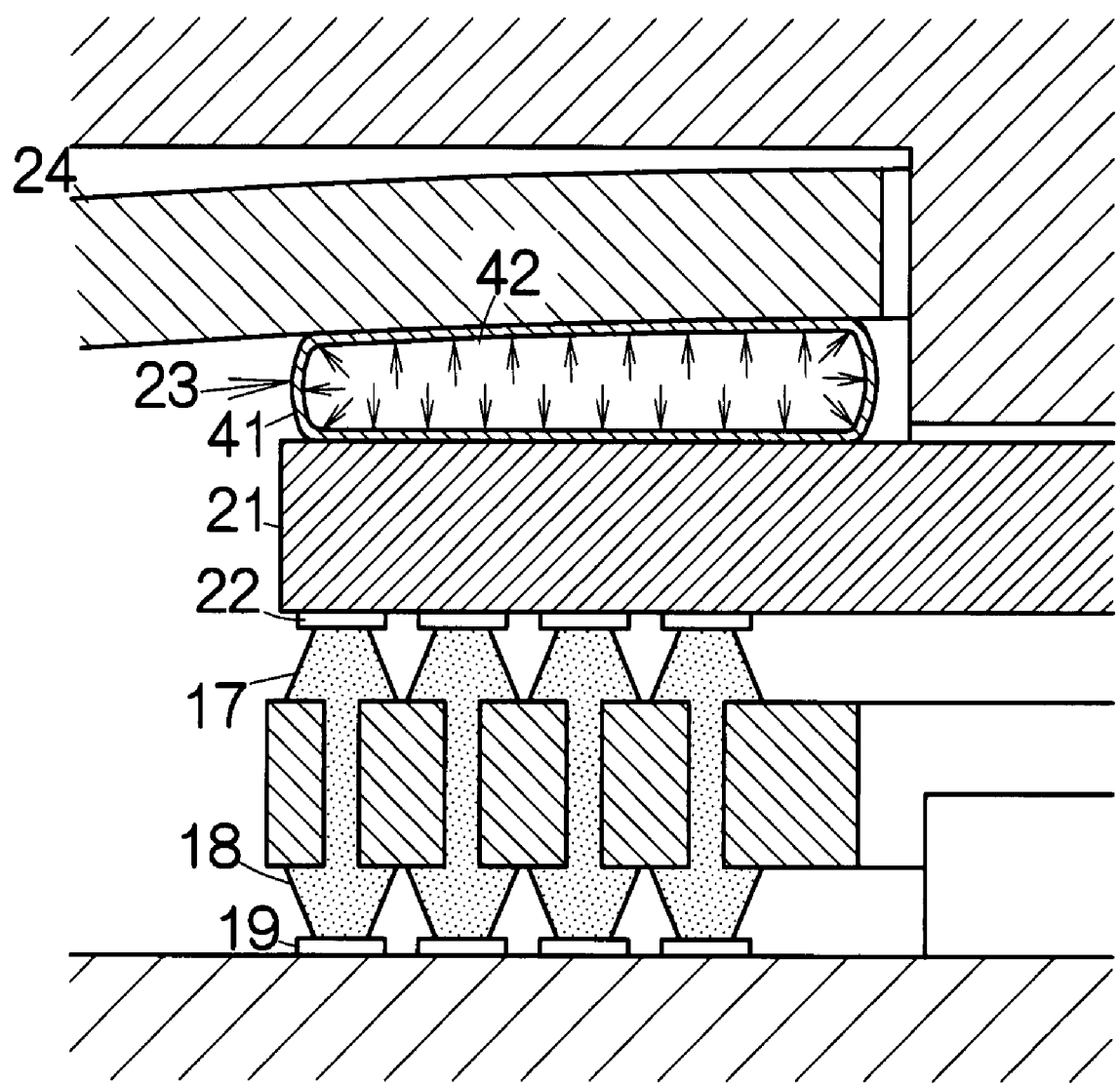
FIG. 6 is an enlarged partially vertical sectional view schematically illustrating a static pressure member.

As is apparent from FIG. 6, the static pressure member 23 includes a bag 41. The bag 41 may be made of a resin or metallic film, for example. The bag 41 may take a doughnut-like shape, for example. The bag 41 is sealed to keep a fluid 42 therein. Air, water, oil or the like may be employed as the fluid 42. When the bag 41 is urged against the upper surface of the package board 21, a static pressure is generated in the bag 41 with the assistance of the fluid 42. A downward urging force is uniformly applied to the package board 21 based on the generated static pressure. Even if utilization of the bolts 26 causes distortion of the urging plate 24, the downward urging force is uniformly applied to the package board 21. Each of the electrically-conductive terminals 17 is thus subjected to the equal urging force. All the electrically-conductive terminals 17 on the upper side of the socket board 16 are reliably brought in contact with the corresponding electrically-conductive terminals 22. This results in a reliable establishment of electric conduction at each pair of the electrically-conductive terminals 17, 18. In the case where the urging force is unevenly applied, the electrically-conductive terminals 17, 18 may receive a reduced urging force in a local area or areas. The electrically-conductive terminals 17, 18 allow incoming of the silicone rubber between the silver particles and the corresponding electrically-conductive terminals 22, 29. The silicone rubber gets into depressions or valleys formed on the surfaces of the electrically-conductive terminals 22, 19 based on the surface roughness of the electrically-conductive terminals 22, 19. The electrically-conductive terminals 22, 19 cannot thus be brought in contact with the silver particles. This results in a failure in electric conduction between the electrically-conductive terminals 17, 18 and the corresponding electrically-conductive terminals 22, 19.

The opening 36 is formed in the socket board 16 as described above. The chip capacitor 37 is located inside the opening 36. The chip capacitor 37 can be placed at the position closest to the LSI chip 35 in this manner. The thickness of the socket board 16 is set to relatively large (for example, approximately 2.0 mm) for the formation of the opening 36. The socket board 16 thus has sufficient strength regardless of the formation of the opening 36. The rigidity of the socket board 16 is also enhanced. The static pressure member 23 serves to equalize the urging force. On the other hand, no opening is formed in a conventional socket board. The thickness of the socket board can be set to relatively small (for example, approximately 0.2 mm). The socket board can deform according to distortion of the urging plate 24, for example. Unevenness in the urging force can thus relatively be suppressed.

Figure 7:
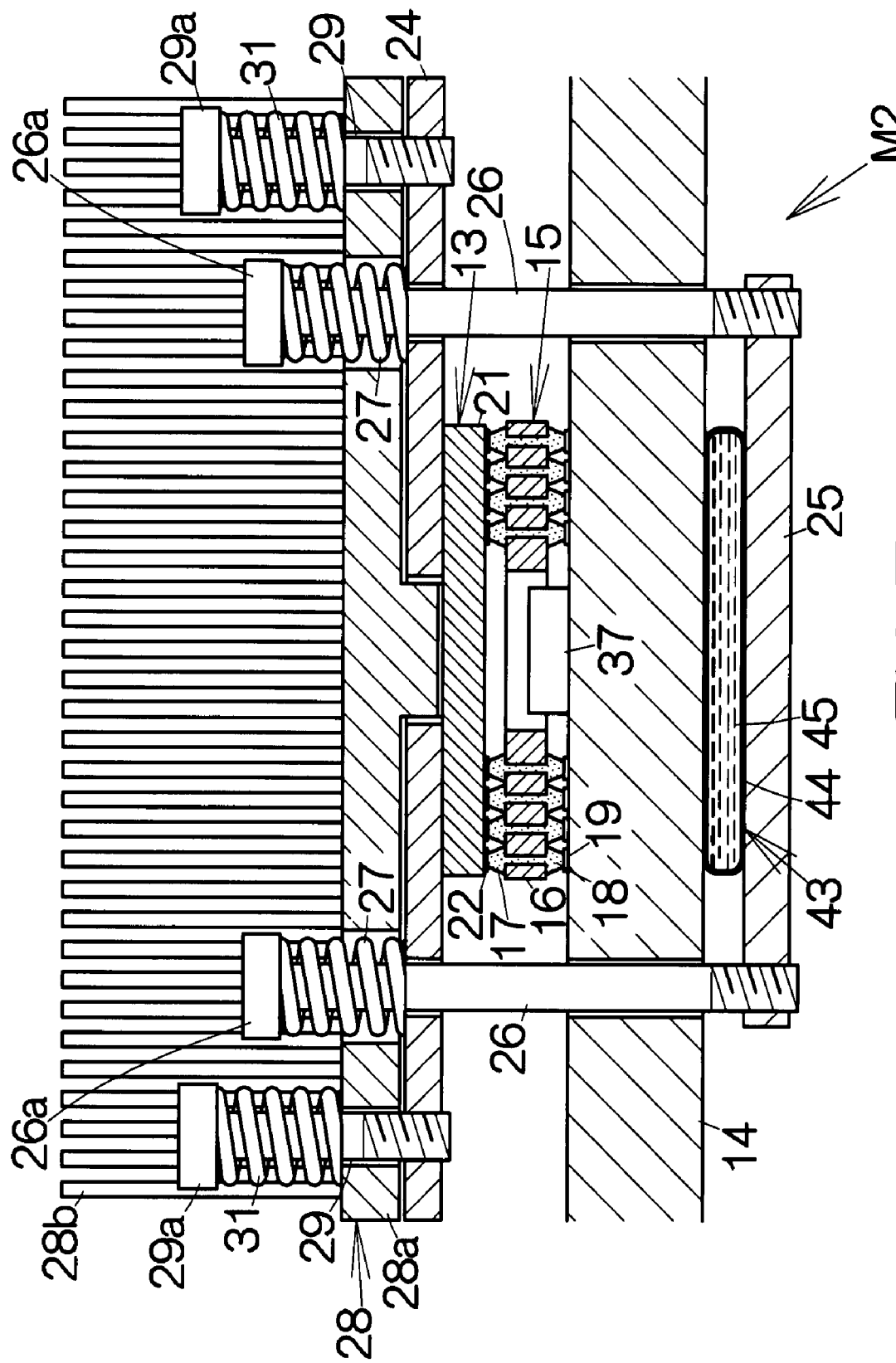
FIG. 7 is a vertically sectional view schematically illustrating the structure of a motherboard according to a second embodiment of the present invention.

As shown in FIG. 7, a static pressure member 43 is interposed between the lower surface of the printed wiring board 14 and the bolster plate 25 in a motherboard M2 according to a second embodiment of the present invention. The static pressure member 43 may be in contact with the lower surface of the printed wiring board 14 at least within the area corresponding to the aforementioned specific area. The static pressure member 43 includes a bag 44 in the same manner as the aforementioned static pressure member 23. The bag 44 may be made of a resin or metallic film, for example. The bag 44 may take a plate shape. A fluid 45 such as air, water, oil or the like may be kept in the sealed bag 44. The urging plate 24 is in contact with the upper surface of the package plate 21 according to the second embodiment. Like reference numerals are attached to the structure or components equivalent to those of the aforementioned first embodiment.

Figure 8:
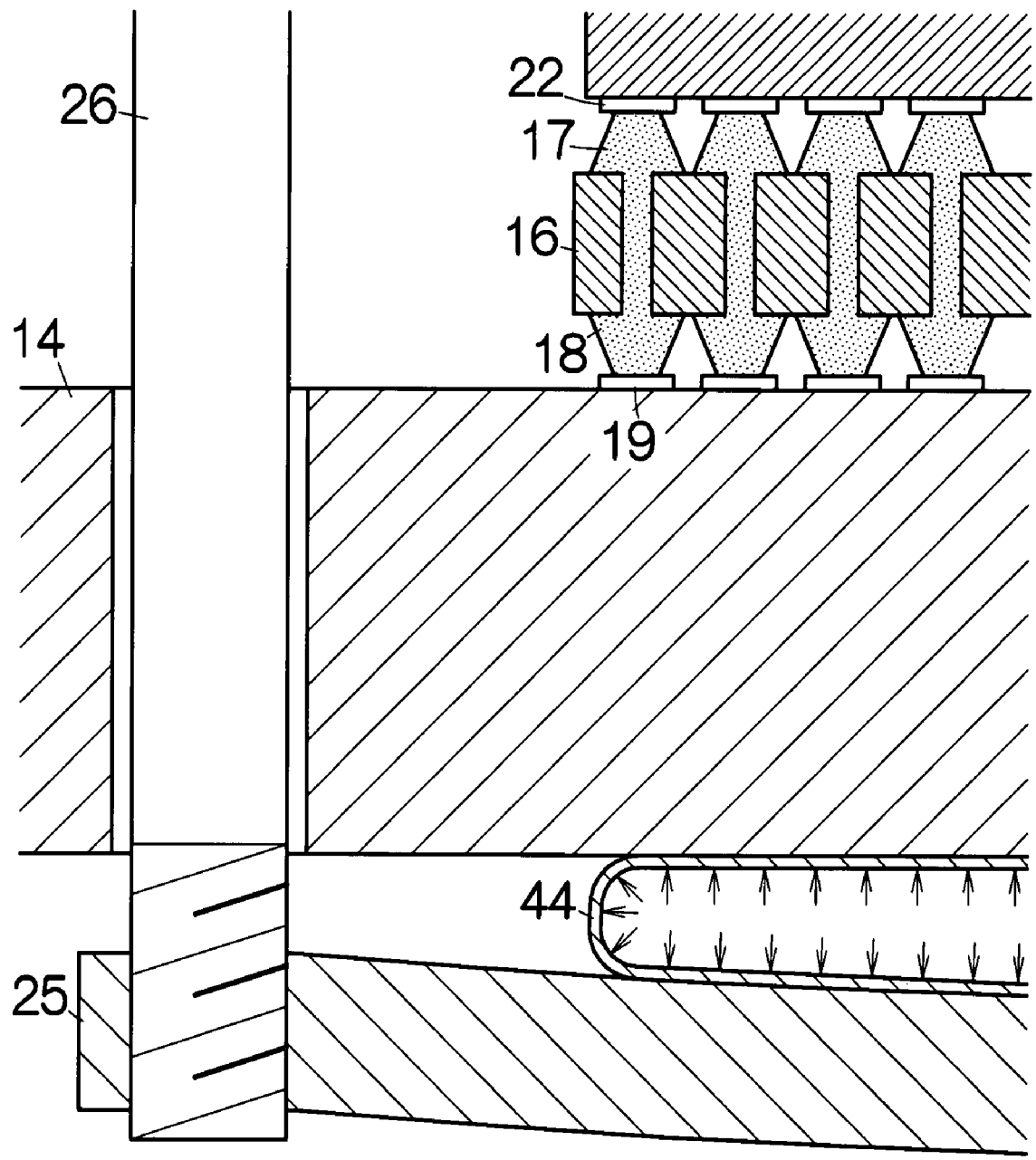
FIG. 8 is an enlarged partially vertical sectional view schematically illustrating a static pressure member.

The bolster plate 25 exhibits an urging force toward the lower surface of the printed wiring board 14 based on the elasticity of the elastic members 27. The bolster plate 25 is urged against the static pressure member 43. The urging force of the bolster plate 25 is transmitted to the printed wiring board 14 through the static pressure member 43. As is apparent from FIG. 8, when the bag 44 is urged against the lower surface of the printed wiring board 14, a static pressure is generated in the bag 44 with the assistance of the fluid 45. An upward urging force is uniformly applied to the printed wiring board 14 based on the generated static pressure. Even if utilization of the bolts 26 causes distortion of the bolster plate 25, the upward urging force is uniformly applied to the printed wiring board 14. Each of the electrically-conductive terminals 18 is thus subjected to the equal urging force. All the electrically-conductive terminals 18 on the lower side of the socket board 16 are thus reliably brought in contact with the corresponding electrically-conductive terminals 19, respectively. This results in a reliable establishment of electric conduction at each pair of the electrically-conductive terminals 17, 18.

Figure 9:
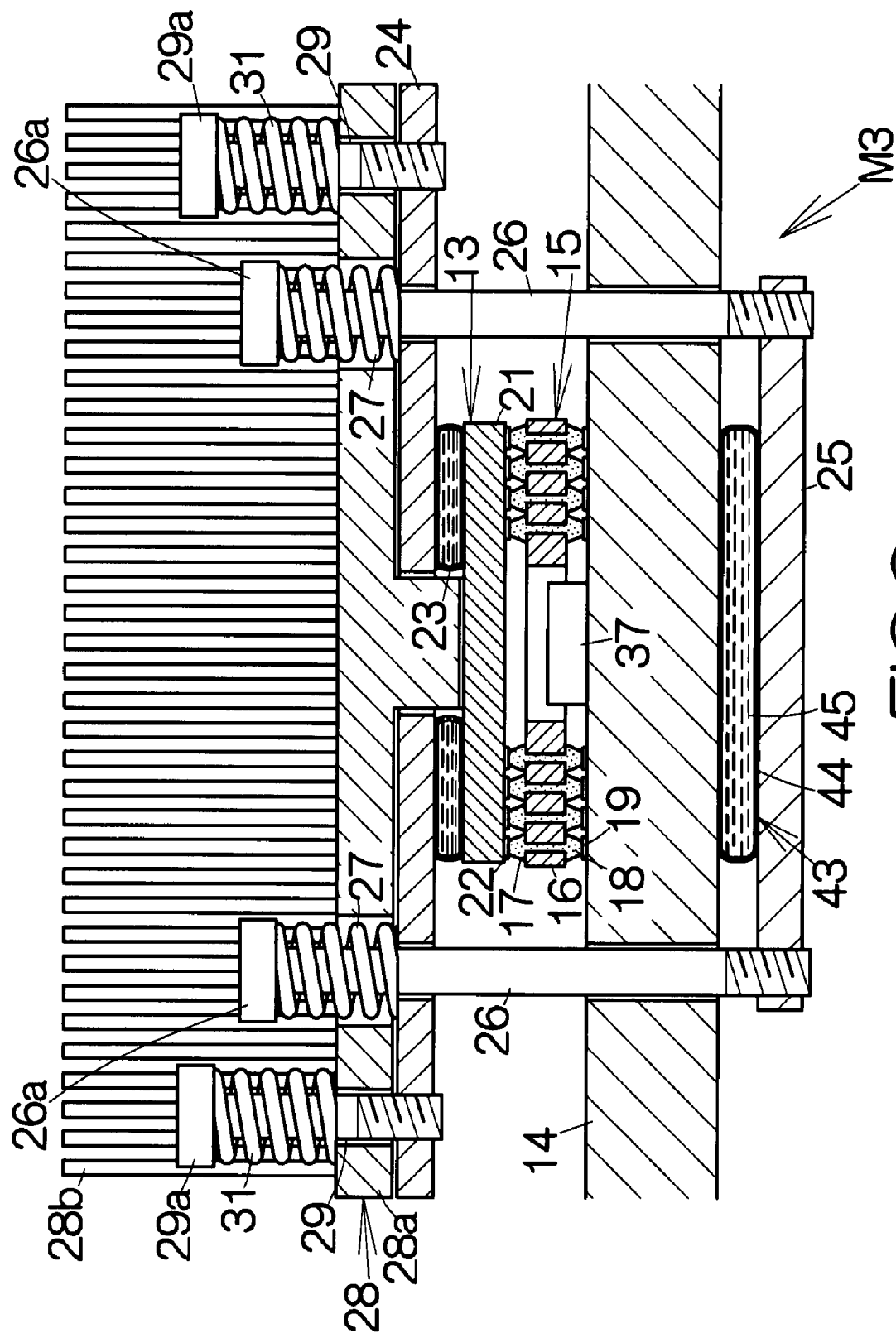
FIG. 9 is a vertically sectional view schematically illustrating the structure of a motherboard according to a third embodiment of the present invention.

As shown in FIG. 9, the static pressure member 23 is interposed between the upper surface of the package board 21 and the urging plate 24, while the static pressure member 43 is interposed between the lower surface of the printed wiring board 14 and the bolster plate 25 in a motherboard M3 according to a third embodiment of the present invention. All the electrically-conductive terminals 17 on the upper side of the socket board 16 are thus reliably brought in contact with the corresponding electrically-conductive terminals 22, respectively, while all the electrically-conductive terminals 18 on the lower side of the socket board 16 are reliably brought in contact with the corresponding electrically-conductive terminals 19, respectively, in the same manner as described above. This results in a reliable establishment of electric conduction at each pair of the electrically-conductive terminals 17, 18. Like reference numerals are attached to the structure or components equivalent to those of the aforementioned first and second embodiments.

It should be noted that the static pressure members 23, 43 may take any shape or form different from the described ones. As long as an urging force is uniformly applied to the upper surface of the package board 21 and/or the lower surface of the printed wiring board 14 within the areas corresponding to the specific area, the static pressure members 23, 43 may take any shape or form. Small-sized springs may be utilized as the static pressure members 23, 43, for example. The small-sized springs may be arranged along the upper surface of the package board 21 and the lower surface of the printed wiring board 14, for example. A fluid pump may be connected to the aforementioned static pressure members 23, 43, for example. Even if the pressure of the static pressure members 23, 43 is reduced because of extension of the bags 41, 44 and/or reduction in the amount of the fluid 42, 45, the fluid pump serves to appropriately enhance the pressure of the static pressure members 23, 43. The numbers, the positions and the arrangement of the electrically-conductive terminals 17, 18, 19, 22 may be different from ones shown in the figures.

What is claimed is:

1. A printed circuit board unit comprising:
   a first board;
   first electrically-conductive terminals fixed and exposed on a front surface of the first board within a specific area of the first board in a matrix;
   second electrically-conductive terminals having flexibility arranged in a matrix, each of the second electrically-conductive terminals disengageably brought in contact with the corresponding first electrically-conductive terminal;
   a second board having a front surface for supporting the second electrically-conductive terminals;
   a static pressure member received on a back surface of the first board within an area corresponding to the specific area to generate a static pressure;
   an urging plate overlaid on the static pressure member so that the static pressure member is interposed between the urging plate and the first board to exhibit an urging force applied to the first board toward the second board;
   an electronic component chip mounted on the back surface of the first board; and
   a heat sink placed on a back side of the urging plate, the heat sink extending through window openings respectively defined in the urging plate and the static pressure member to touch the electronic component chip, the heat sink exhibiting an urging force applied to the electronic component toward the second board independently from the urging force of the urging plate.

2. The printed circuit board unit according to claim 1, wherein each of the second electrically-conductive terminals comprises:
   a solid silicone rubber; and
   silver particles dispersing in the silicone rubber.

3. The printed circuit board unit according to claim 1, wherein the static pressure member comprises:
   a bag; and
   a fluid filled in the bag.

4. An electronic apparatus comprising the printed circuit board unit according to claim 1.

5. The printed circuit board unit according to claim 1, further comprising:
   an opening formed in the second board, the opening penetrating through the second board between the front surface to a back surface of the second board;
   third electrically-conductive terminals having flexibility arranged in a matrix on the back surface of the second board at a position around the opening, each of the third electrically-conductive terminals connected to the corresponding second electrically-conductive terminal;
   a third board having a front surface facing the back surface of the second board at a distance;
   fourth electrically-conductive terminals fixed on the front surface of the third board in a matrix, each of the fourth electrically-conductive terminals disengageably brought in contact with the corresponding third electrically-conductive terminal; and
an electronic component mounted on the front surface of the third board, the electronic component disposed in the opening.

6. An electronic apparatus comprising the printed circuit board unit according to claim 5.

7. The printed circuit board unit according to claim 1, further comprising:
third electrically-conductive terminals having flexibility arranged in a matrix on a back surface of the second board, each of the third electrically-conductive terminals connected to the corresponding second electrically-conductive terminal;
a third board having a front surface facing the back surface of the second board at a distance;
fourth electrically-conductive terminals fixed on the front surface of the third board in a matrix, each of the fourth electrically-conductive terminals disengageably brought in contact with the corresponding third electrically-conductive terminal;
an electronic component chip mounted on the back surface of the third board; and
an auxiliary urging plate brought in contact with a back surface of the third board, the auxiliary urging plate exhibiting an urging force applied to the third board toward the second board.

8. The printed circuit board unit according to claim 7, wherein each of the third electrically-conductive terminals comprises:
a solid silicone rubber; and
silver particles dispersing in the silicone rubber.

9. The printed circuit board unit according to claim 7, further comprising:
an opening formed in the second board, the opening penetrating through the second board between the front surface and a back surface of the second board; and
an electronic component mounted on the back surface of the third board, the electronic component disposed in the opening.

10. An electronic apparatus comprising the printed circuit board unit according to claim 9.

11. The printed circuit board unit according to claim 1, further comprising:
third electrically-conductive terminals having flexibility arranged in a matrix on a back surface of the second board, each of the third electrically-conductive terminals connected to the corresponding second electrically-conductive terminal;
a third board having a front surface facing the back surface of the second board at a distance;
fourth electrically-conductive terminals exposed on the front surface of the third board within a specific area of the third board in a matrix, each of the fourth electrically-conductive terminals disengageably brought in contact with the corresponding third electrically-conductive terminal;
an electronic component chip mounted on the back surface of the third board;
an auxiliary static pressure member received on the back surface of the third board within an area corresponding to the specific area to generate a static pressure; and
an auxiliary urging plate overlaid on the auxiliary static pressure member so that the auxiliary static pressure member is interposed between the auxiliary urging plate and the third board to exhibit an urging force applied to the third board toward the second board.

12. The printed circuit board unit according to claim 11, wherein each of the third electrically-conductive terminals comprises:
a solid silicone rubber; and
silver particles dispersing in the silicone rubber.

13. The printed circuit board unit according to claim 11, wherein the static pressure member comprises:
a bag; and
a fluid filled in the bag.

14. The printed circuit board unit according to claim 1 further comprising:
an opening formed in the second board, the opening penetrating through the second board between the front surface and a back surface of the second board;
an electronic component mounted on the front surface of the first board, the electronic component disposed in the opening;
third electrically-conductive terminals having flexibility arranged in a matrix on the back surface of the second board at a position around the opening, each of the third electrically-conductive terminals connected to the corresponding second electrically-conductive terminal;
a third board having a front surface facing the back surface of the second board at a distance;
fourth electrically-conductive terminals exposed on the front surface of the third board within a specific area of the third board in a matrix, each of the fourth electrically-conductive terminals disengageably brought in contact with the corresponding third electrically-conductive terminal;
an electronic component chip mounted on the back surface of the third board;
an auxiliary static pressure member received on the back surface of the third board within an area corresponding to the specific area to generate a static pressure; and
an auxiliary urging plate overlaid on the auxiliary static pressure member so that the auxiliary static pressure member is interposed between the auxiliary urging plate and the third board to exhibit an urging force applied to the third board toward the second board.

15. An electronic apparatus comprising the printed circuit board unit according to claim 14.

* * * * *